US007727830B2

United States Patent
Jin et al.

(10) Patent No.: US 7,727,830 B2
(45) Date of Patent: Jun. 1, 2010

(54) FABRICATION OF GERMANIUM NANOWIRE TRANSISTORS

(75) Inventors: Been-Yih Jin, Lake Oswego, OR (US); Jack T. Kavalieros, Portland, OR (US); Matthew V. Metz, Hillsboro, OR (US); Marko Radosavljevic, Beaverton, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 151 days.

(21) Appl. No.: 12/006,273

(22) Filed: Dec. 31, 2007

(65) Prior Publication Data

US 2009/0170251 A1 Jul. 2, 2009

(51) Int. Cl.
*H01L 21/337* (2006.01)
(52) U.S. Cl. .................. 438/197; 438/588; 257/66; 257/331; 257/347; 257/E21.112; 257/E29.264; 257/E21.421
(58) Field of Classification Search .......... 438/197, 438/149, 151, 176, 198, 211, 257, 283, 588, 438/142, 195, 213, 229; 257/66, 72, 250, 257/331, 347, E21.179, E27.112, E29.264, 257/E29.275
See application file for complete search history.

(56) References Cited

U.S. PATENT DOCUMENTS

| 7,588,977 | B2 * | 9/2009 | Suk et al. .................. 438/197 |
| 7,622,773 | B2 * | 11/2009 | Irisawa et al. ............... 257/347 |
| 2008/0237575 | A1 * | 10/2008 | Jin et al. ...................... 257/19 |
| 2009/0085027 | A1 * | 4/2009 | Jin et al. ...................... 257/24 |

* cited by examiner

Primary Examiner—W. David Coleman
Assistant Examiner—Su C Kim
(74) Attorney, Agent, or Firm—Ryder, Lu, Mazzeo and Konieczny, LLC; Douglas J. Ryder

(57) ABSTRACT

In general, in one aspect, a method includes using the Germanium nanowire as building block for high performance logic, memory and low dimensional quantum effect devices. The Germanium nanowire channel and the SiGe anchoring regions are formed simultaneously through preferential Si oxidation of epitaxial Silicon Germanium epi layer. The placement of the germanium nanowires is accomplished using a Si fin as a template and the germanium nanowire is held on Si substrate through SiGe anchors created by masking the two ends of the fins. High dielectric constant gate oxide and work function metals wrap around the Germanium nanowire for gate-all-around electrostatic channel on/off control, while the Germanium nanowire provides high carrier mobility in the transistor channel region. The germanium nanowire transistors enable high performance, low voltage (low power consumption) operation of logic and memory devices.

13 Claims, 12 Drawing Sheets

FABRICATION OF GERMANIUM NANOWIRE TRANSISTORS

BACKGROUND

Germanium (Ge) nanowires are formed, by Ge confinement method, as high mobility transistor channels to create logic, memory and low dimensional quantum transport devices. The Ge nanowires are integrated on a Silicon (Si) substrate by preferentially oxidizing SiGe epi layers to confine the Ge atoms in core nanowire region, the Ge nanowires are self-aligned using the Si fin as template. The method also include forming wrap around high dielectric constant gate dielectrics, work function metal, gate control lines, and attaching of electrical terminal contacts to the nanowires thereto. As devices continue to scale, the high mobility germanium nanowire devices provide better control of short channel effects such as sub threshold slop and drain induced barrier lowering.

BRIEF DESCRIPTION OF THE DRAWINGS

The features and advantages of the various embodiments will become apparent from the following detailed description in which.

DETAILED DESCRIPTION

In order to reduce or eliminate the limitations (such as controlling nanowire dimension, orientation, and placement) associated with integrating nanowires on Si substrate the nanowires may be formed as part of the semiconductor transistor fabrication processing. FIGS. 1-12 illustrate an example process for forming a high carrier mobility germanium nanowire transistor.

Figure 1:
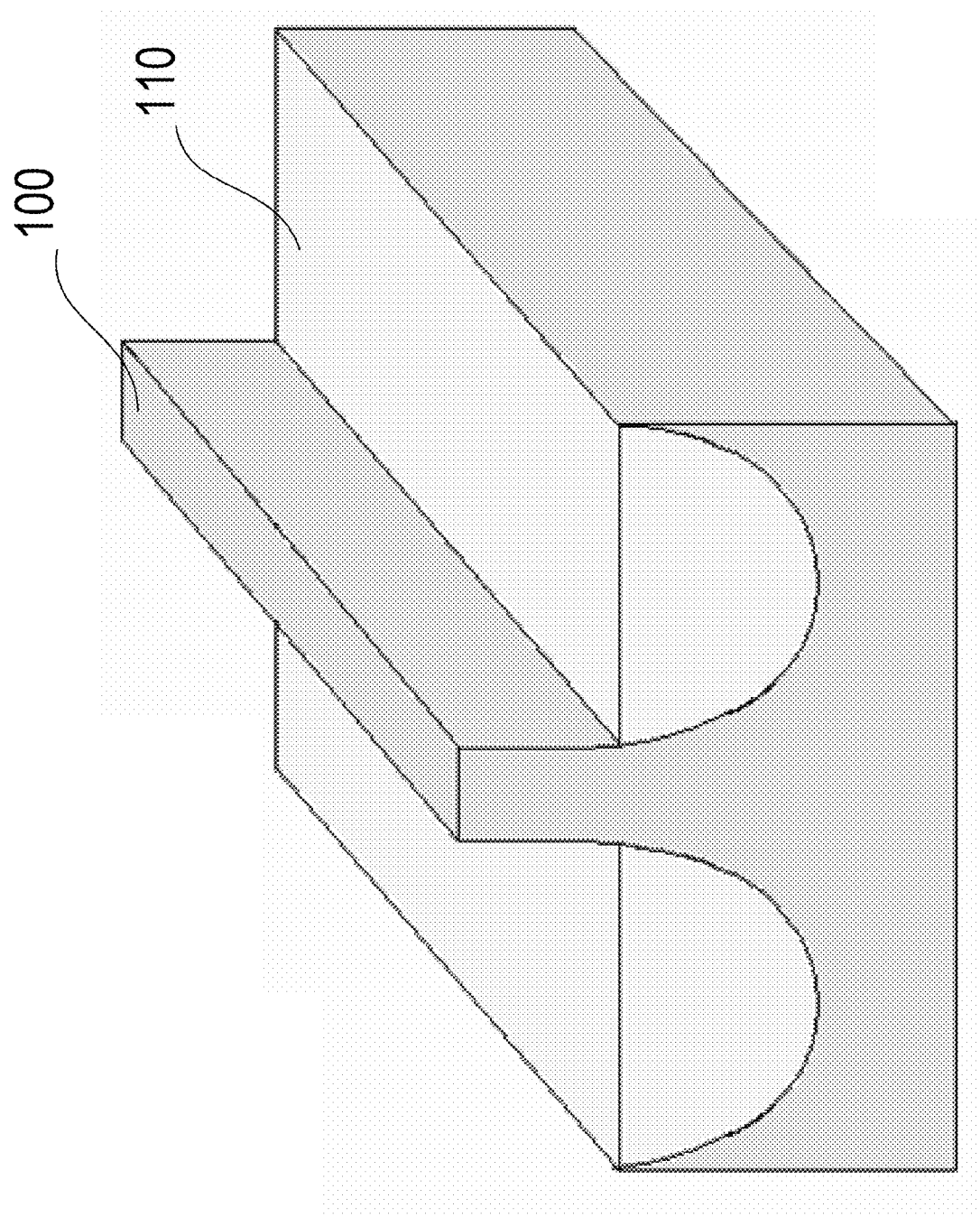
FIG. 1 illustrates an example substrate having a silicon fin surrounded by trench isolation regions, according to one embodiment.

FIG. 1 illustrates an example substrate having a silicon fin 100 surrounded by trench isolation regions 110 (e.g., silicon oxide). The silicon fin 100 and the trench isolation regions 110 may be formed through any number of known processes. For example, lithography may be utilized to pattern fins in a resist layer over a silicon substrate and then the silicon substrate may be etched using the resist pattern to form trenches in the silicon substrate on each side of the fins (trench isolation lithography). The trenches may be filled with an oxide material and then polished to the same height as the top of the Si fins. The Si fins can then be formed by recessing the trench oxide to a desired depth to expose the sidewall of the Si fins.

Figure 2:
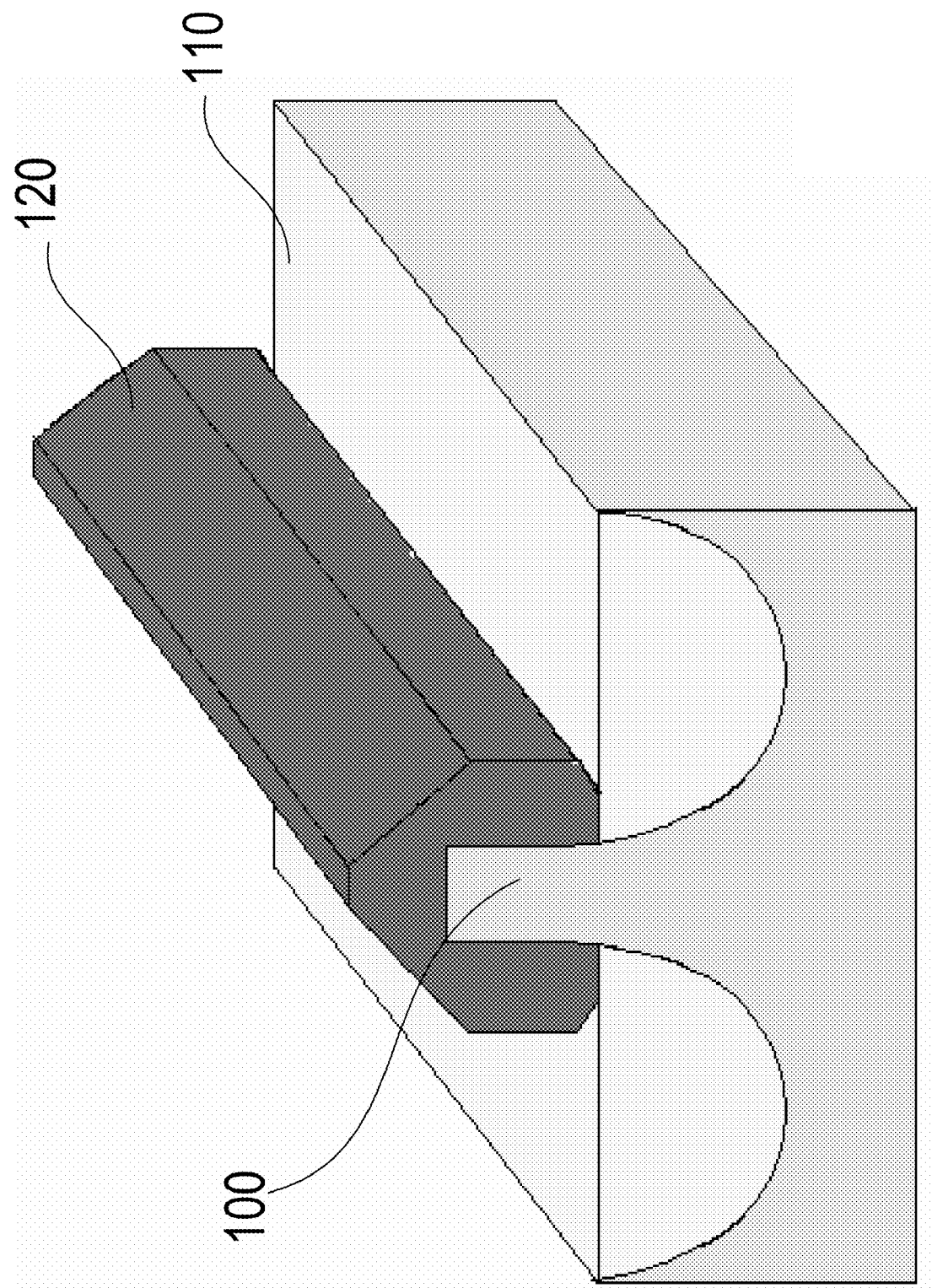
FIG. 2 illustrates the example substrate after a silicon germanium layer is selectively formed on three sides of the fin, according to one embodiment.

FIG. 2 illustrates the example substrate after a silicon germanium (Si$_{1-x}$Ge$_x$) layer 120 is selectively formed (grown) on three sides of the fin 100. The initial percentage of Ge (x) in the Si$_{1-x}$Ge$_x$ layer 120 may be in the range of 5-40%. The Si$_{1-x}$Ge$_x$ layer 120 may be formed (grown) through any number of known processes.

Figure 3:
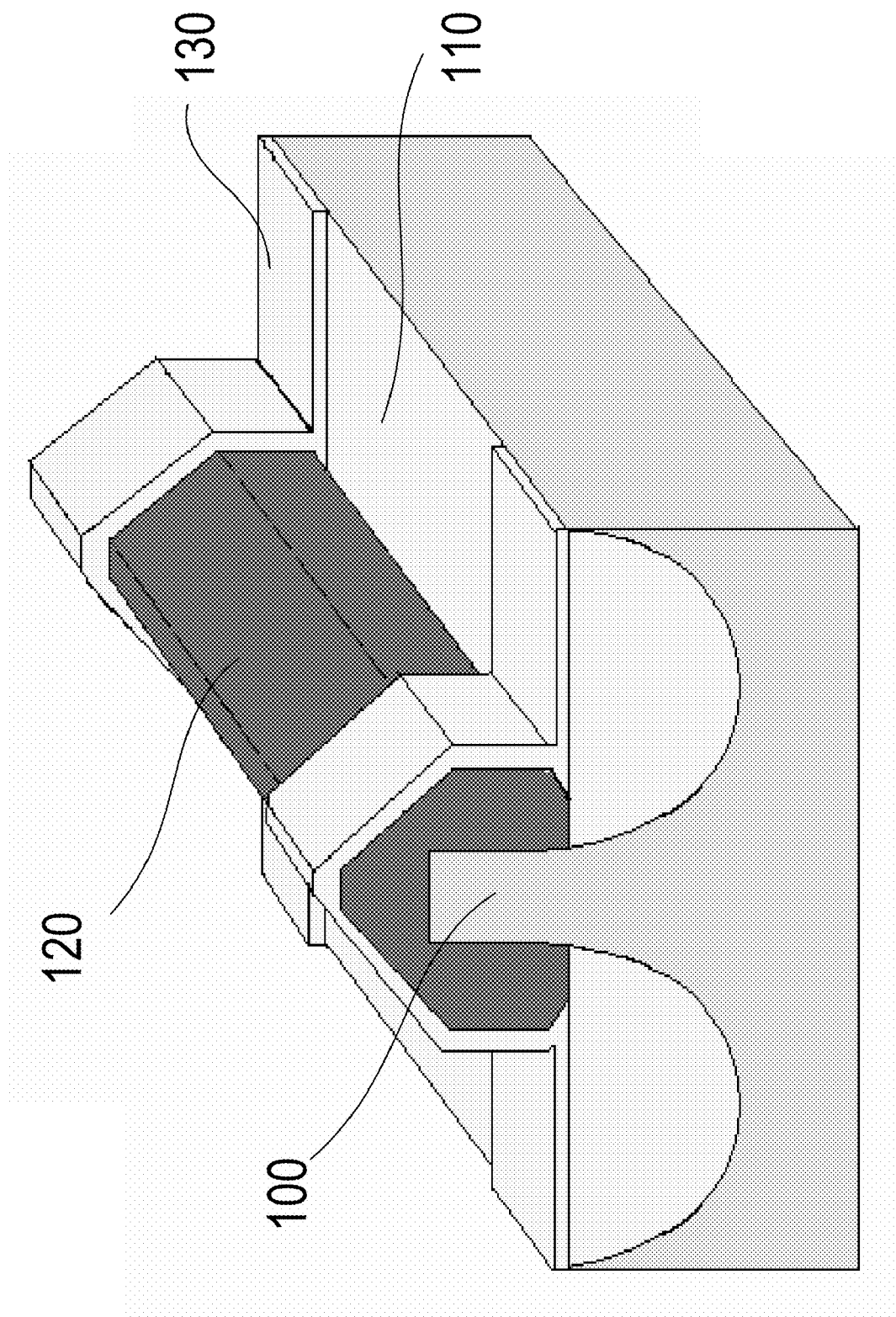
FIG. 3 illustrates the example substrate after an oxide masking layer is formed and patterned at the two end regions of the fin, according to one embodiment.

FIG. 3 illustrates the example substrate after an oxide masking layer 130 is formed and patterned at the two end regions (e.g., source/drain) of the fin 100 on top of the Si$_{1-x}$Ge$_x$ layer 120. The oxide masking layer 130 may be formed and patterned through any number of known processes. For example, the oxide masking layer 130 may be blanket deposited over the entire substrate and then etched back over the channel region using a resist layer patterned by photolithography.

Figure 4:
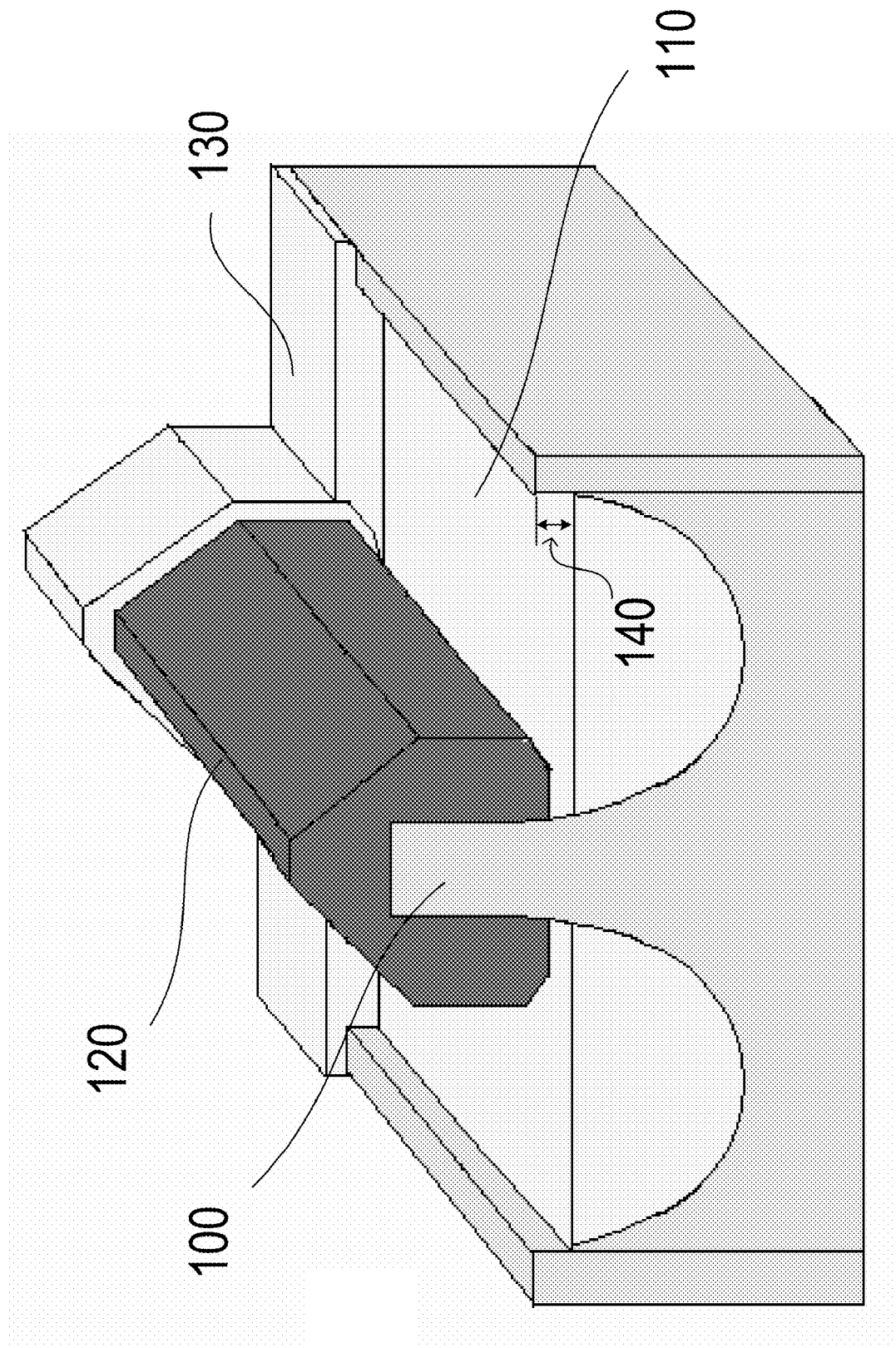
FIG. 4 illustrates a half cut of the example substrate after the trench isolation regions are recess etched so as to expose the base of the middle section of the fin, according to one embodiment.

FIG. 4 illustrates the example substrate after the trench isolation regions 110 are recess etched so as to expose the base of the fin 100. That is, a gap 140 (e.g., 100 to 200 angstroms) is formed between the bottom of the Si$_{1-x}$Ge$_x$ layer 120 and the top of the trench isolation regions 110. The Si$_{1-x}$Ge$_x$ layer 120 doesn't contact the trench isolation regions 110 in the middle section (e.g., channel) of the fin 100, rather it rests above the trench isolation regions 110 with a gap 140. FIG. 4 illustrates a half cut of the substrate (e.g., doesn't display front oxide masking layer 130) for ease of illustrating the gap 140. The trench isolation regions 110 may be etched through any number of known processes.

Figure 5:
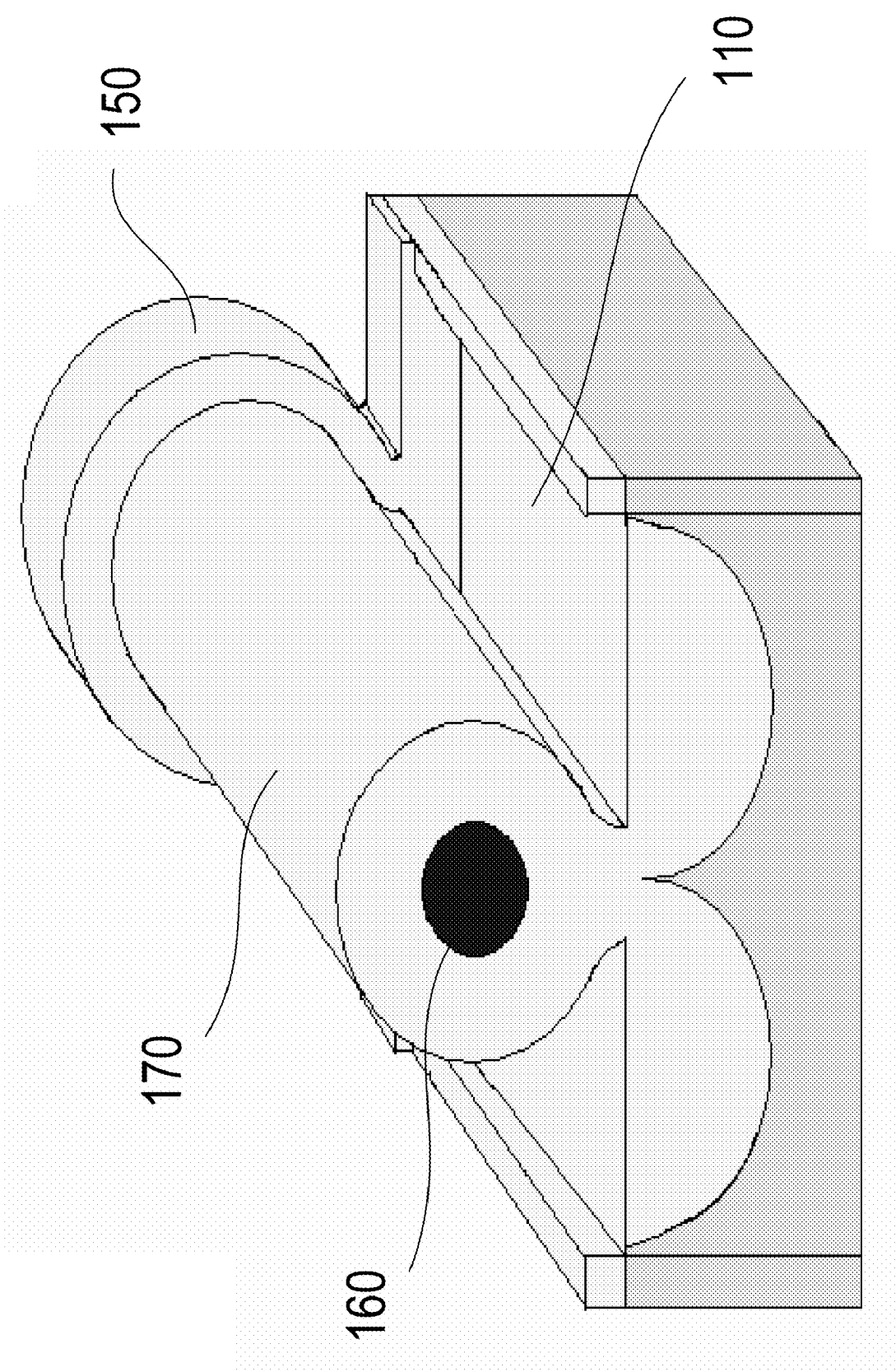
FIG. 5 illustrates a half cut of the example substrate after preferential silicon oxidation, according to one embodiment.

FIG. 5 illustrates a half cut (for ease of illustration) of the example substrate after preferential silicon oxidation (diffusion of silicon from layers containing silicon). The preferential Si oxidation creates Si$_{1-y}$Ge$_y$ anchoring pillars (not visible) surrounded by a silicon (SiO$_2$) layer 150 over the two end regions under oxide masking layer 130, and a germanium nanowire 160 surrounded by a grown SiO$_2$ layer 170 over the middle region. The Si oxidation in the two oxide masked end regions is slower then the middle region due to the longer Si diffusion path, through the thicker oxide masking layer 130, to the oxidation surface. The Si oxidation is optimized to fully convert the Si$_{1-x}$Ge$_x$ layer 120 in the Si$_{1-x}$Ge$_x$ exposed middle region into the Ge nanowire core 160, where the Germanium core is completely electrically isolated from the Si substrate by fully oxidizing and pinching off the base of the Si fin 100. The oxidation is further optimized to partially convert the Si$_{1-x}$Ge$_x$ layer 120 in the two oxide masked end regions into $Si_{1-y}Ge_y$ pillars (y>x), where the Si fin at the base is not completely oxidized so the $Si_{1-y}Ge_y$ pillars are anchored to the Si substrate.

Figure 6:
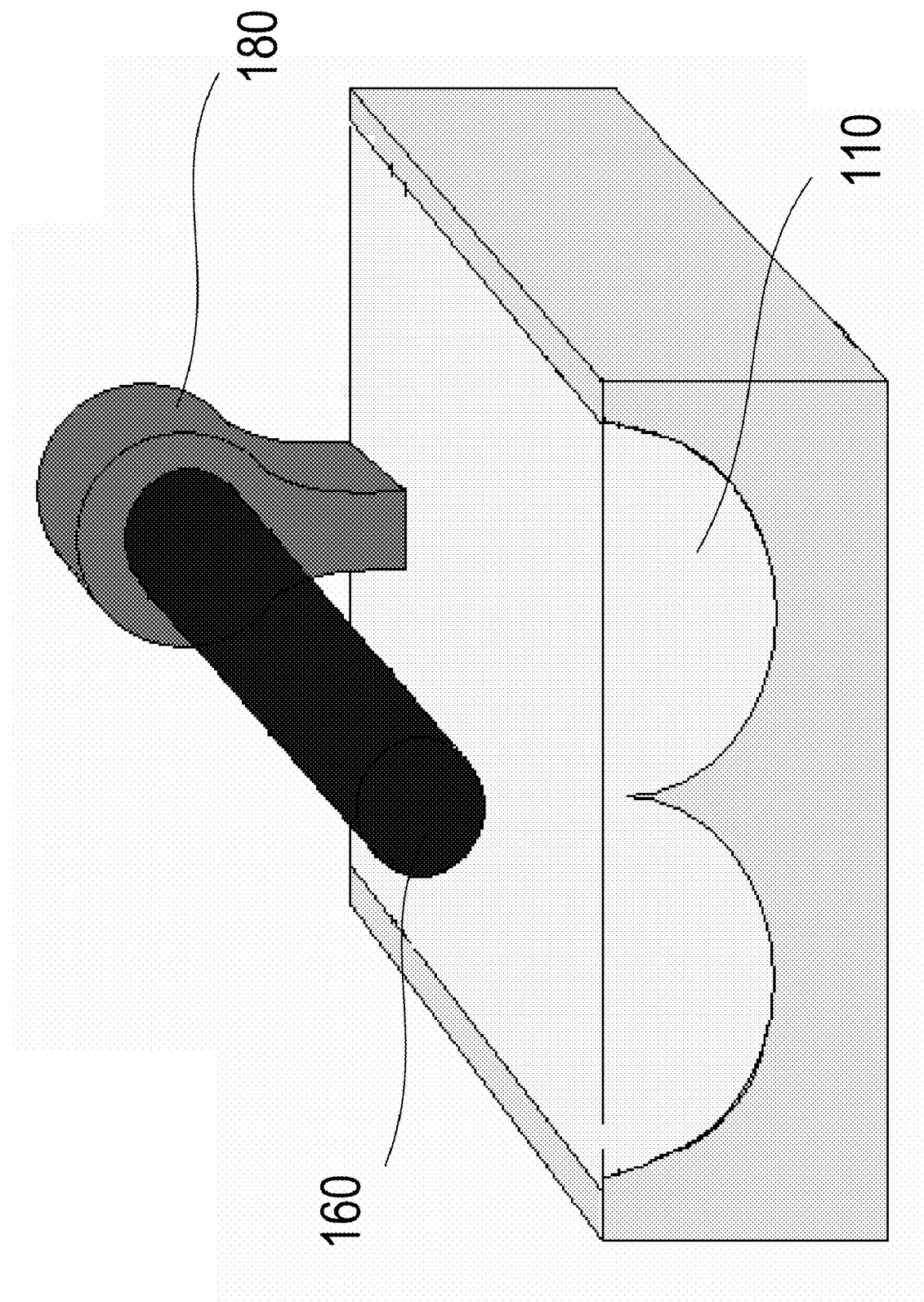
FIG. 6 illustrates a half cut of the example substrate after the SiO$_2$ layers are selectively removed from the Ge nanowire and the Si$_{1-y}$Ge$_y$ pillars, according to one embodiment.

FIG. 6 illustrates a half cut of the example substrate after the $SiO_2$ layers 150, 170 are selectively removed from the Ge nanowire 160 and the $Si_{1-y}Ge_y$ pillars 180. The Ge nanowire 160 is now floating over the substrate while the $Si_{1-y}Ge_y$ pillars 180 are anchored on the Si substrate at the base of the Si fins at two ends. The $SiO_2$ layers 150, 170 may be selectively removed through any number of known processes.

Figure 7:
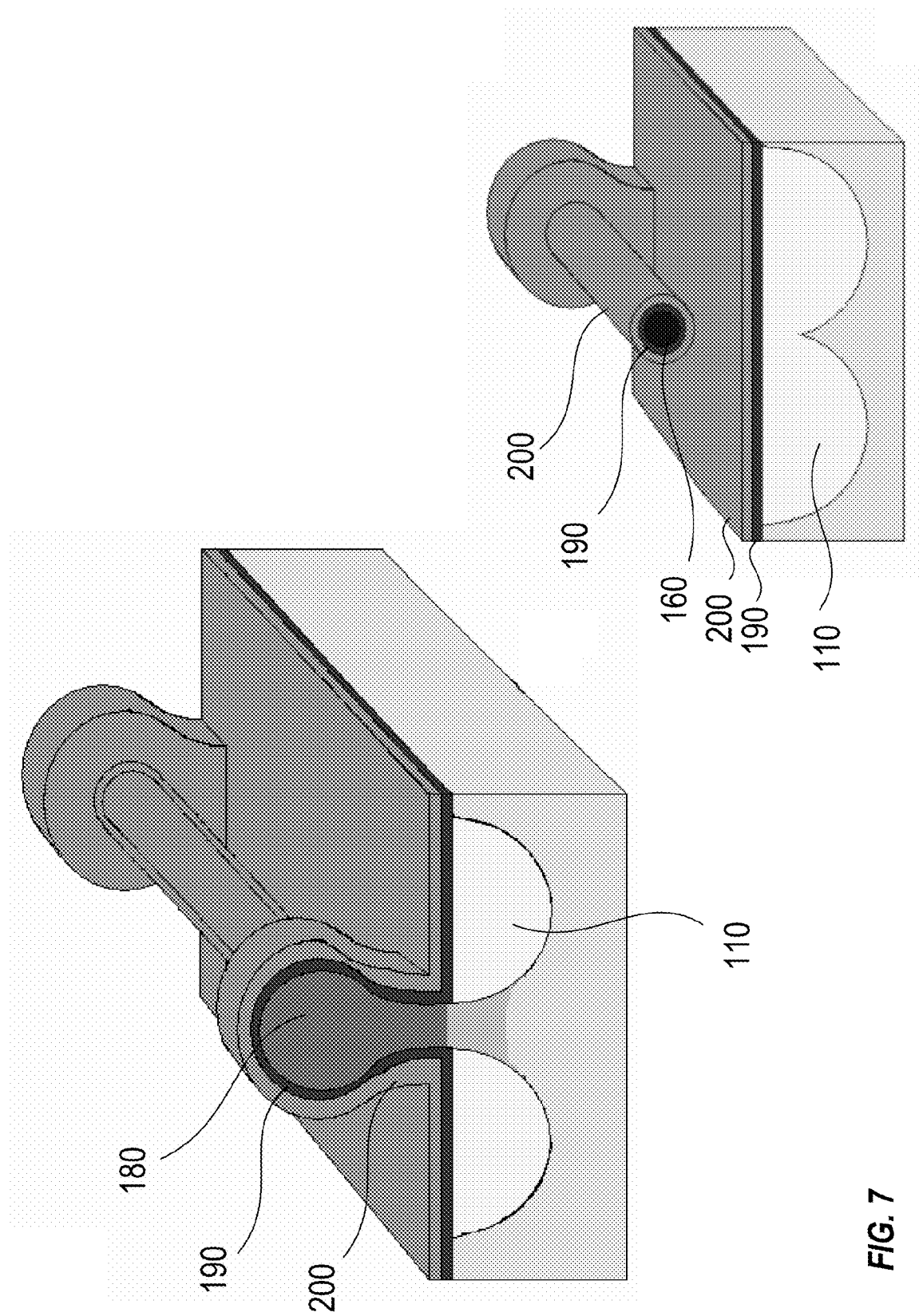
FIG. 7 illustrates a full view and a half cut view of the example substrate after a dielectric layer and a conductive layer are formed so as to wrap around the Ge nanowire and the Si$_{1-y}$Ge$_y$ pillars, according to one embodiment.

FIG. 7 illustrates a full view and a half cut view of the example substrate after a dielectric layer (e.g., high dielectric constant material) 190 is formed so as to wrap around the Ge nanowire 160 and the $Si_{1-y}Ge_y$ pillars 180 and a conductive layer (e.g., work function metal) 200 is formed so as to wrap around the dielectric layer 190. The dielectric layer 190 and the metal layer 200 may be formed through any number of known processes.

Figure 8:
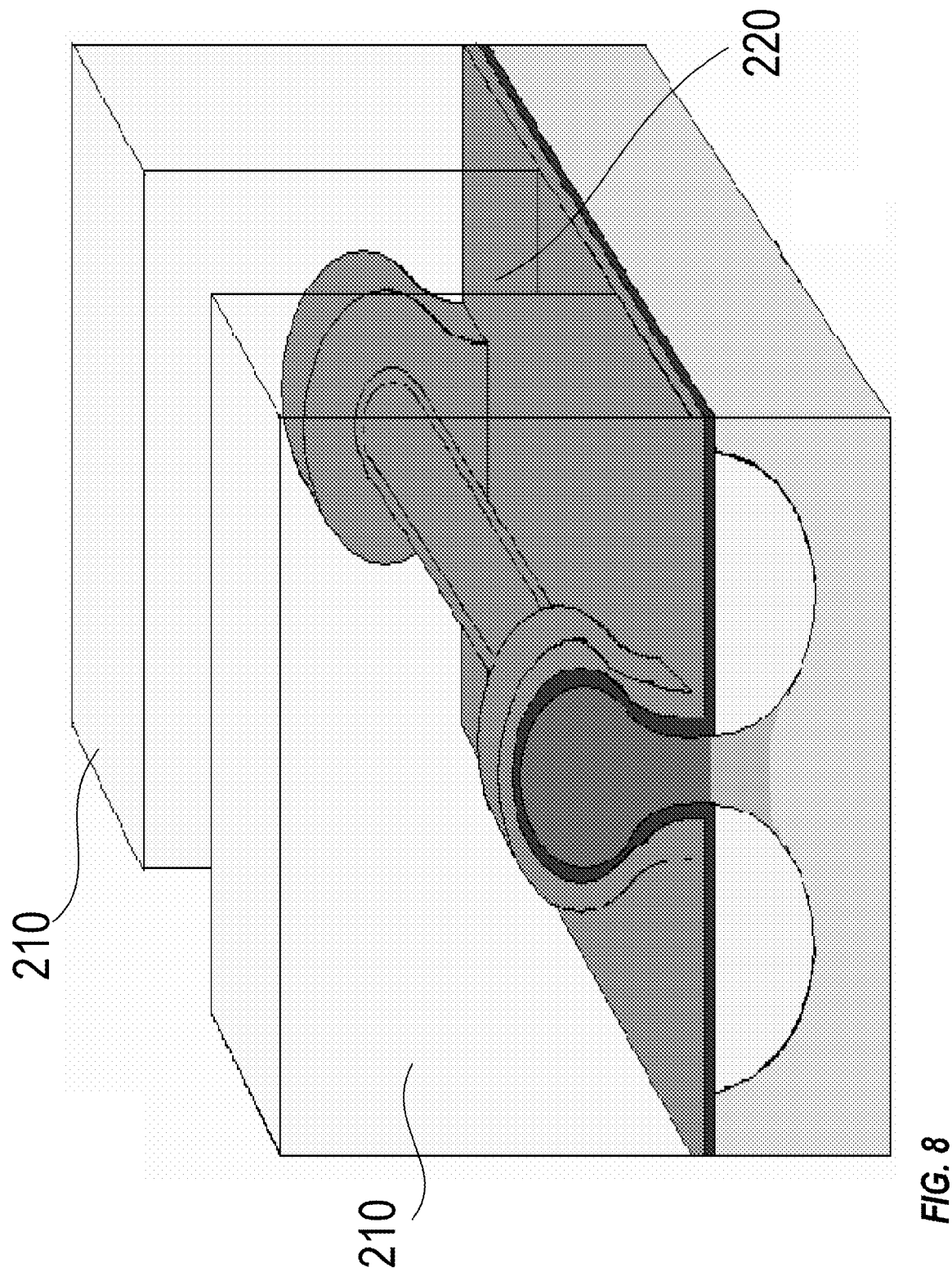
FIG. 8 illustrates the example substrate after a sacrificial oxide layer is formed and a trench is formed therein at a gate line location, according to one embodiment.

FIG. 8 illustrates the example substrate after a sacrificial oxide layer 210 is formed over the substrate and then a trench 220 is formed in the sacrificial oxide layer at a gate line location (e.g., over the channel). The sacrificial oxide layer 210 and the trench 220 may be formed through any number of known processes. For example the trench 220 may be formed by patterning (photolithography) a resist layer and etching the trench using the resist layer as a pattern.

Figure 9:
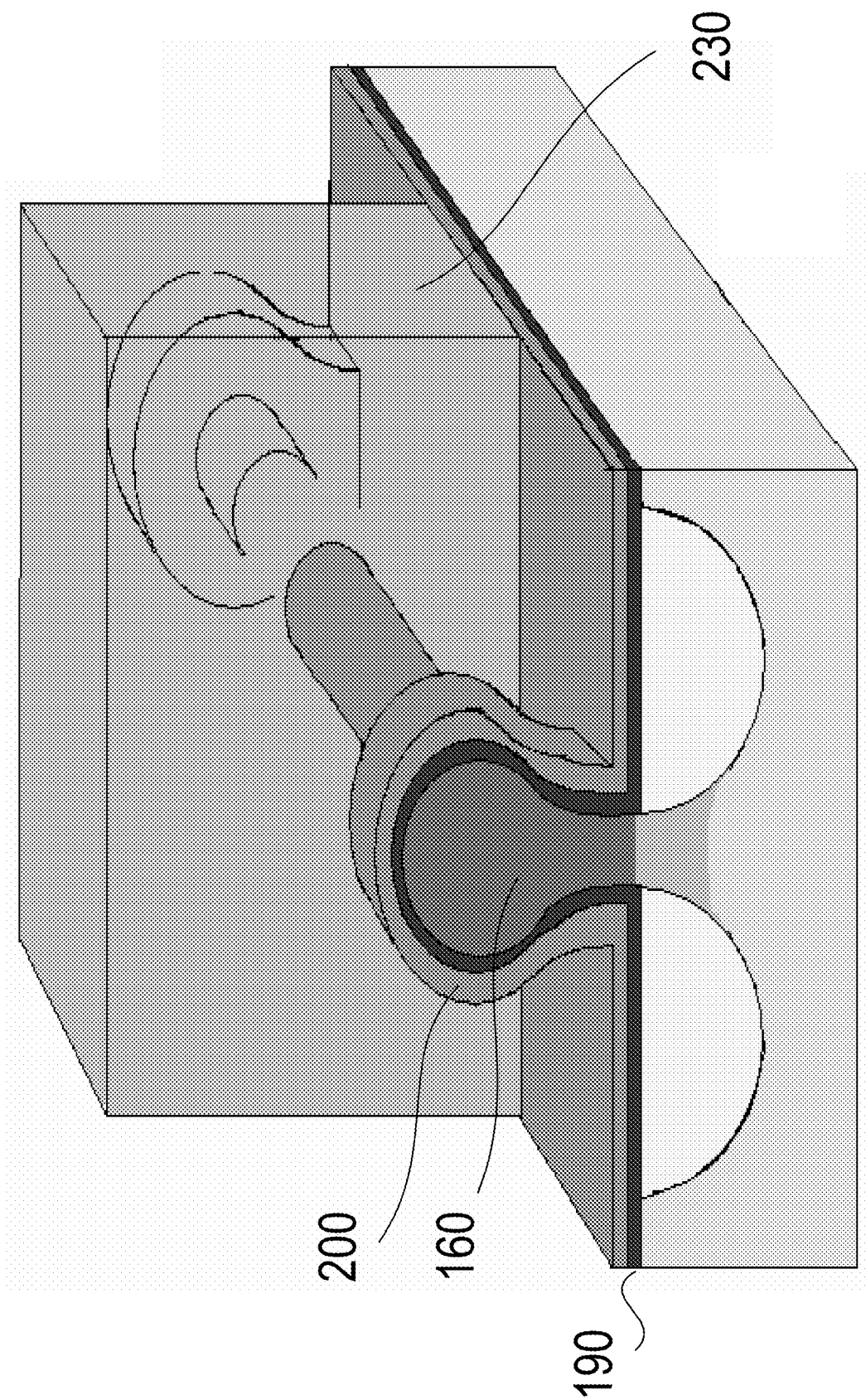
FIG. 9 illustrates the example substrate after a gate polysilicon line is formed in the trench and the sacrificial oxide layer is removed, according to one embodiment.

FIG. 9 illustrates the example substrate after a gate polysilicon line 230 is formed inside the trench 220 and the sacrificial oxide layer 210 is removed. The gate polysilicon line 230 may be formed and the sacrificial oxide layer 210 may be removed through any number of known processes. For example, a polysilicon layer may be formed over the entire substrate (including inside the trench 220) and then may be polished to remove the polysilicon layer from above the sacrificial oxide layer 210 so it is only contained within the trench 220.

A nitride dielectric hard mask capping layer (not illustrated) may be formed on top of the polysilicon gate lines for lithography purpose, to prevent poly loss during spacer etch, and to block Epi SiGe growth later on. The nitride dielectric hard mask capping layer may be formed through any number of known processes. For example, prior to removing the sacrificial oxide layer 210 the nitride hard mask capping layer may be formed by selectively recessing the polysilicon gate line, backfilling the recessed area with a nitride layer (blanket nitride deposition), and polishing back the nitride layer to remove unwanted nitride on top of the sacrificial oxide.

Figure 10:
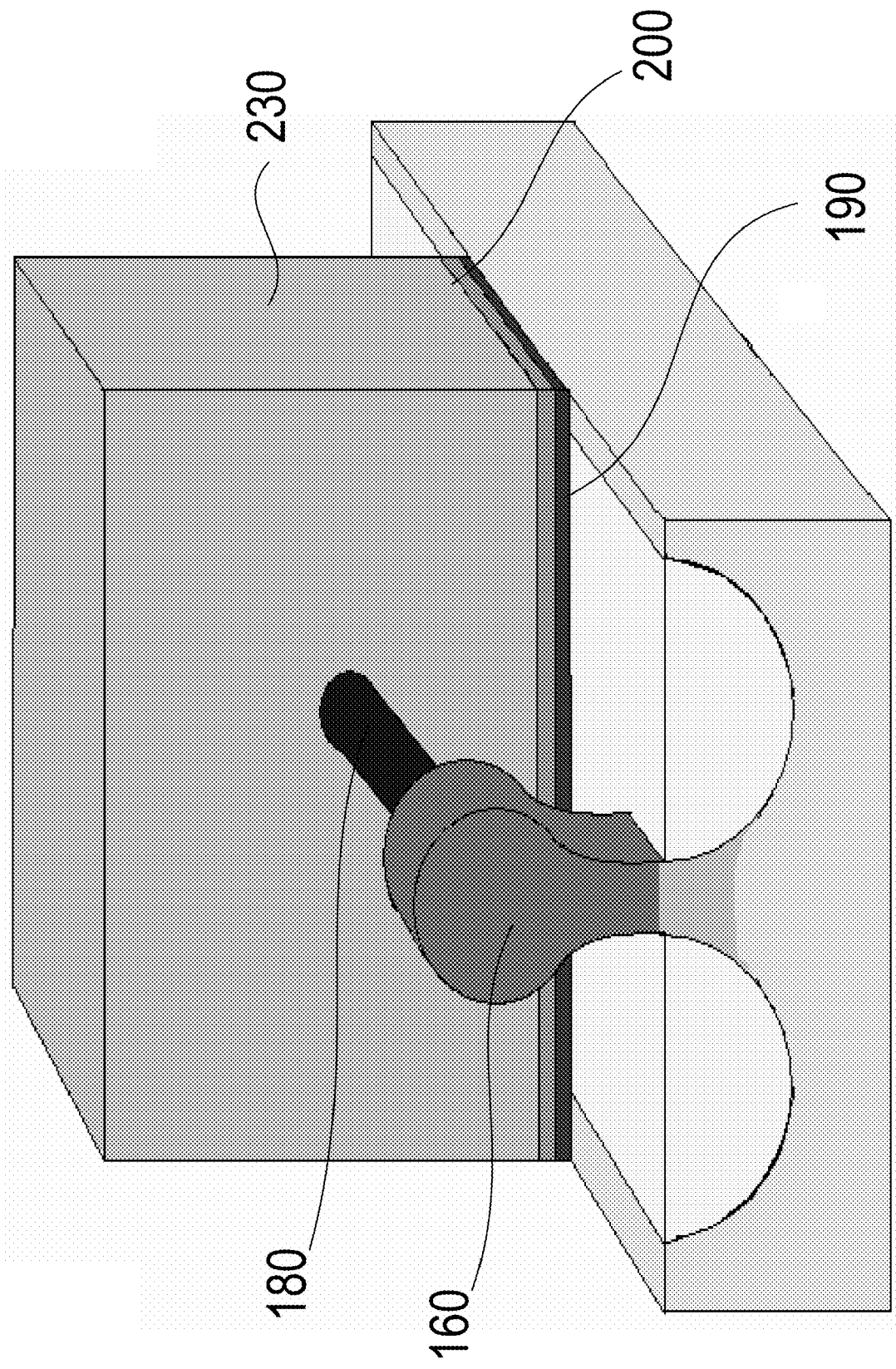
FIG. 10 illustrates the example substrate after the dielectric layer and the conductive layer are removed from the regions not protected by the gate polysilicon line, according to one embodiment.

FIG. 10 illustrates the example substrate after the dielectric layer 190 and the metal layer 200 are removed from the regions not protected by the gate polysilicon line 230 (the source/drain regions). The insulating layer 190 and the conductive layer 200 may be removed through any number of known processes.

Figure 11:
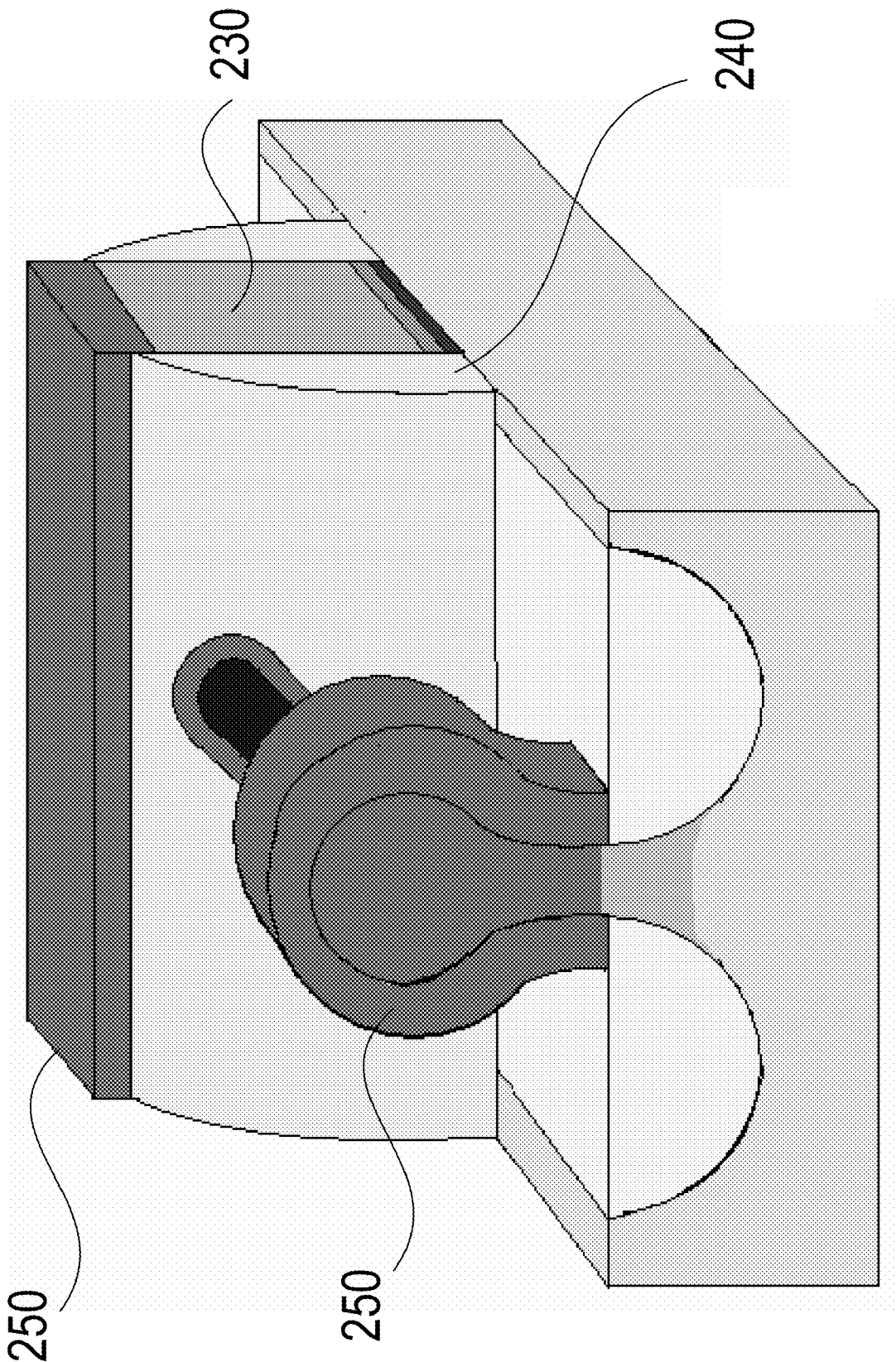
FIG. 11 illustrates the example substrate after a spacer layer is formed on the gate polysilicon line and an in-situ doped SiGe layer is formed over the substrate, according to one embodiment.

FIG. 11 illustrates the example substrate after a spacer layer 240 is formed on the gate polysilicon line 230 and an in-situ doped SiGe layer 250 is formed (grown) over the substrate (on pillars 160, nanowire 180 and poly gate line 230). The spacer layer 240 and the in-situ doped SiGe layer 250 may be formed through any number of known processes.

Figure 12:
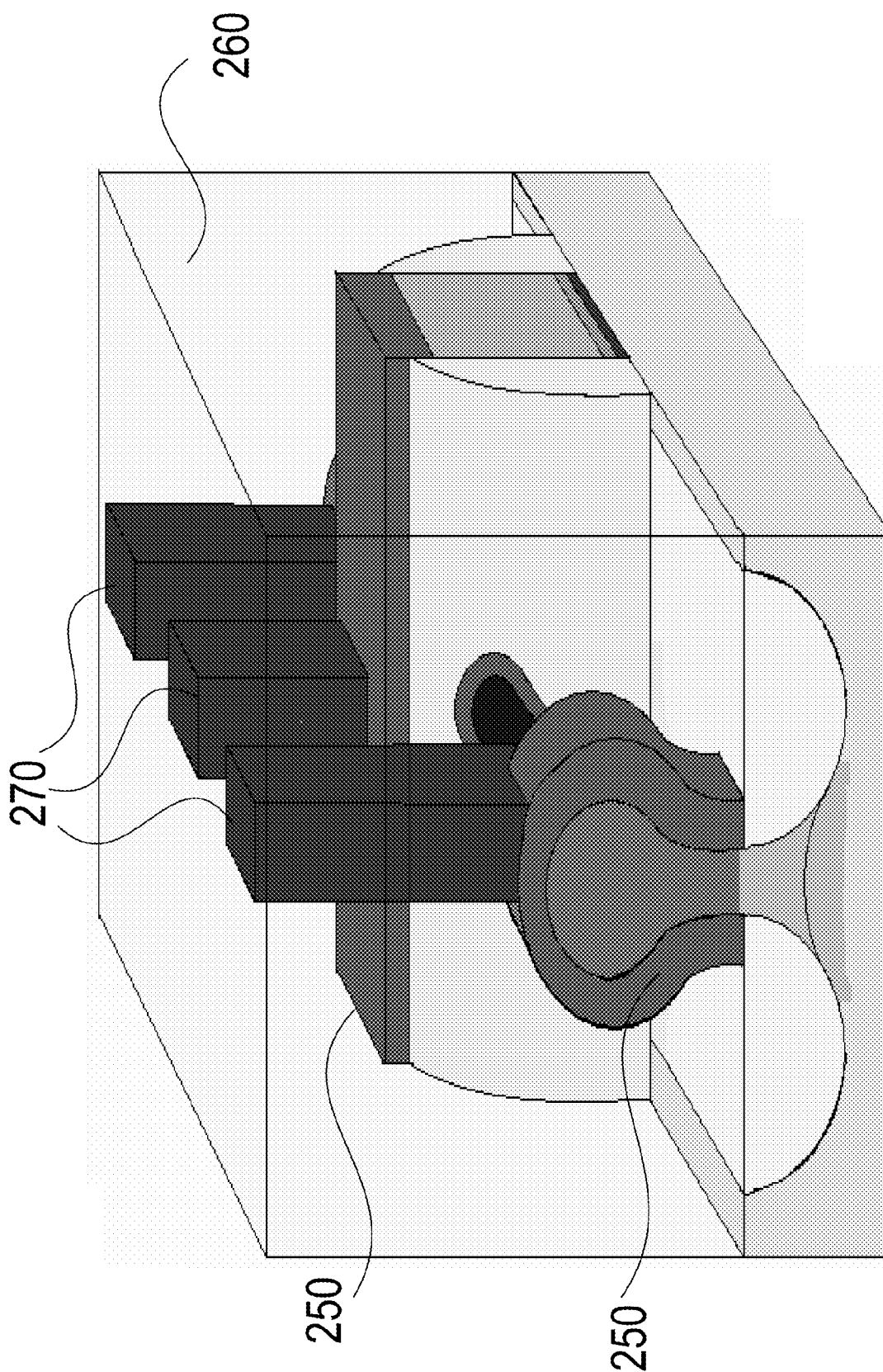
FIG. 12 illustrates the example substrate after source/drain implant, silicide and Germanide formation, interlayer dielectric deposition, and contact formation, according to one embodiment.

FIG. 12 illustrates the example substrate after source/drain implant of the source/drain regions, silicide and Germanide formation of the SiGe layer 250 over the pillars 160, the nanowire 180 and the poly gate line 230, interlayer dielectric deposition 260, and contact formation 270. The implanting, silicide/germanide formation, interlayer dielectric deposition 260, and contact formation 270 can be performed through any number of known processes.

Although the disclosure has been illustrated by reference to specific embodiments, it will be apparent that the disclosure is not limited thereto as various changes and modifications may be made thereto without departing from the scope. Reference to "one embodiment" or "an embodiment" means that a particular feature, structure or characteristic described therein is included in at least one embodiment. Thus, the appearances of the phrase "in one embodiment" or "in an embodiment" appearing in various places throughout the specification are not necessarily all referring to the same embodiment.

The various embodiments are intended to be protected broadly within the spirit and scope of the appended claims.

The invention claimed is:

1. A method comprising:
   forming an silicon fin surrounded by trench isolation regions in a semiconductor substrate;
   forming a silicon germanium layer over the silicon fin;
   forming oxide masking layers at two end regions of the silicon fins;
   exposing the silicon germanium layer in middle region of the silicon fin to preferential silicon oxidation to form a germanium nanowire in the middle region of the silicon fin and silicon germanium pillar anchors at the two oxide masked end regions of the silicon fin;
   forming an dielectric layer over the substrate;
   forming a conducting layer over the dielectric layer; and
   forming a polysilicon gate line.

2. The method of claim 1, further comprising recess etching the trench isolation regions to expose foot of the silicon fin in the middle section of the fin where there is no oxide masking layer.

3. The method of claim 1, wherein the exposing includes optimizing the silicon oxidation conditions to fully convert the silicon germanium layer over the middle region of the silicon fin into the germanium nanowire, while partially converting the silicon germanium layer at the two oxide masked end regions into the silicon germanium pillars, wherein the silicon germanium pillars contain a higher percentage of germanium than the silicon germanium layer.

4. The method of claim 1, wherein
   the forming an dielectric layer includes forming a high dielectric constant layer; and
   the forming a conducting layer includes forming a metallic layer with work function matched to the Germanium nanowire.

5. The method of claim 1, wherein the forming a polysilicon gate line includes
   forming a sacrificial oxide layer over the substrate;
   forming a trench in the sacrificial oxide layer over a channel region;
   forming the polysilicon gate line within the trench; and
   removing the sacrificial oxide layer.

6. The method of claim 1, further comprising forming contacts in alignment with source/drain regions and the polysilicon gate line.

7. The method of claim 6, wherein the forming contacts includes
   forming an interlayer dielectric layer over the substrate;
   etching contact holes in the interlayer dielectric layer in alignment with the source/drain regions and the polysilicon gate line; and
   forming contact plugs within the contact holes.

8. The method of claim 1, further comprising
   removing the dielectric layer and the conducting layer from source/drain regions; and forming a silicon germanium layer over the polysilicon gate line, the germanium nanowire in the source/drain regions, and the silicon germanium anchors.

9. A method comprising:

forming an silicon fin surrounded by trench isolation regions in a semiconductor substrate;

forming a silicon germanium layer over the silicon fin;

forming oxide masking layers at two end regions of the fin;

etching the trench isolation regions to expose foot of the silicon fin in middle region of the fin;

exposing the substrate to silicon oxidation to fully convert the silicon germanium layer in the middle region of the fin into a germanium nanowire, while partially converting the silicon germanium layer at the two oxide masked end regions into silicon germanium pillars, wherein the silicon germanium pillars contain a higher percentage of germanium than the silicon germanium layer;

forming a high dielectric constant layer over the germanium nanowire and the silicon germanium pillars;

forming a metal work function layer over the high dielectric constant layer;

forming a sacrificial oxide layer over the substrate;

forming a trench in the sacrificial oxide layer over a channel region; and forming a polysilicon gate line within the trench.

10. The method of claim 9, further comprising removing the high dielectric constant layer and the metal work function layer from source/drain regions; and forming a silicon germanium layer over the polysilicon gate line, the germanium nanowire in the source/drain regions and the silicon germanium anchors.

11. The method of claim 10, further comprising forming an interlayer dielectric layer over the substrate;

etching contact holes in the interlayer dielectric layer in alignment with the source/drain regions and the polysilicon gate line; and forming contact plugs within the contact holes.

12. The method of claim 9, further comprising implanting source/drain regions.

13. The method of claim 9, further comprising silicide and germanide formation of source/drain regions and polysilicon gate line.

* * * * *